(12) United States Patent
Bae et al.

(10) Patent No.: US 10,090,334 B2
(45) Date of Patent: Oct. 2, 2018

(54) DISPLAY PANEL INCLUDING EXTERNAL CONDUCTIVE PAD, DISPLAY APPARATUS INCLUDING THE SAME AND METHOD OF MANUFACTURING THE SAME

(71) Applicant: Samsung Display Co., Ltd., Yongin-Si, Gyeonggi-Do (KR)

(72) Inventors: Sung-hwan Bae, Asan-si (KR); Seunghee Oh, Goyang-si (KR); Joonhyeong Kim, Cheonan-si (KR); Younggoo Song, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 9 days.

(21) Appl. No.: 15/403,346

(22) Filed: Jan. 11, 2017

(65) Prior Publication Data

US 2017/0358602 A1 Dec. 14, 2017

(30) Foreign Application Priority Data

Jun. 8, 2016 (KR) .................. 10-2016-0071253

(51) Int. Cl.
*H01L 33/00* (2010.01)
*H01L 27/12* (2006.01)
(Continued)

(52) U.S. Cl.
CPC .......... *H01L 27/124* (2013.01); *H01L 23/482* (2013.01); *H01L 24/05* (2013.01);
(Continued)

(58) Field of Classification Search
CPC ....... H01L 27/124; H01L 24/05; H01L 24/08; H01L 27/1259; H01L 23/482;
(Continued)

(56) References Cited

U.S. PATENT DOCUMENTS

| 7,710,035 | B2* | 5/2010 | Ryu ..................... H01J 11/12 313/112 |
| 8,193,706 | B2 | 6/2012 | Kim |
| 8,259,247 | B2* | 9/2012 | Sugiyama .............. G02F 1/1345 349/138 |
| 8,410,696 | B2 | 4/2013 | Lee et al. |

(Continued)

FOREIGN PATENT DOCUMENTS

| JP | 10268791 A | 10/1998 |
| KR | 10-0297372 B1 | 5/2001 |

(Continued)

*Primary Examiner* — Vu A Vu
(74) *Attorney, Agent, or Firm* — Cantor Colburn LLP

(57) ABSTRACT

A display apparatus includes a first base substrate defining: an outer edge thereof at which a side surface is exposed, and an upper surface thereof connected to the outer edge; first and second guiding dams on the upper surface and extending from an inside of the first base substrate to the outer edge; a first signal line on the upper surface and extending between the first and second guiding dams from the inside of the first base substrate to the outer edge thereof; and a first side pad connected to the first signal line. The first side pad includes a first horizontal portion on the upper surface and extending between the first and second guiding dams, in a top plan view, and the first horizontal portion extending to define a first vertical portion which is disposed on the side surface.

20 Claims, 16 Drawing Sheets

(51) Int. Cl.
*H01L 23/482* (2006.01)
*H01L 23/00* (2006.01)
*H05K 1/11* (2006.01)
*H05K 1/18* (2006.01)
*H01L 27/32* (2006.01)
*G02F 1/1345* (2006.01)

(52) U.S. Cl.
CPC .......... *H01L 24/08* (2013.01); *H01L 27/1259* (2013.01); *H05K 1/117* (2013.01); *H05K 1/189* (2013.01); *G02F 1/13452* (2013.01); *G02F 1/13458* (2013.01); *H01L 27/3276* (2013.01); *H01L 2224/0556* (2013.01); *H01L 2224/081* (2013.01); *H05K 2201/10128* (2013.01)

(58) Field of Classification Search
CPC ........... H01L 27/3276; H01L 2224/081; H01L 2224/0556; H05K 1/189; H05K 1/117; H05K 2201/10128; G02F 1/13452; G02F 1/13458
USPC .......................................................... 257/91
See application file for complete search history.

(56) References Cited

U.S. PATENT DOCUMENTS

| | | | |
|---|---|---|---|
| 8,994,042 B2 | 3/2015 | Kang et al. | |
| 2007/0096652 A1* | 5/2007 | Chang | H01J 9/242 |
| | | | 313/586 |
| 2007/0121049 A1 | 5/2007 | Kuo et al. | |
| 2012/0281032 A1* | 11/2012 | Yoshihama | G09G 3/003 |
| | | | 345/691 |
| 2013/0335660 A1* | 12/2013 | Jung | G02F 1/1345 |
| | | | 349/42 |
| 2014/0085585 A1* | 3/2014 | Sung | G02F 1/13458 |
| | | | 349/143 |
| 2014/0104528 A1 | 4/2014 | Jung et al. | |
| 2015/0179670 A1 | 6/2015 | Kang et al. | |

FOREIGN PATENT DOCUMENTS

| | | |
|---|---|---|
| KR | 10-0529559 B1 | 11/2005 |
| KR | 10-0532866 B1 | 11/2005 |
| KR | 10-0544817 B1 | 1/2006 |
| KR | 1020070007431 A | 1/2007 |
| KR | 1020080098145 A | 11/2008 |
| KR | 10-0891987 B1 | 3/2009 |
| KR | 1020150011731 A | 2/2015 |
| KR | 1020150074275 A | 7/2015 |

* cited by examiner

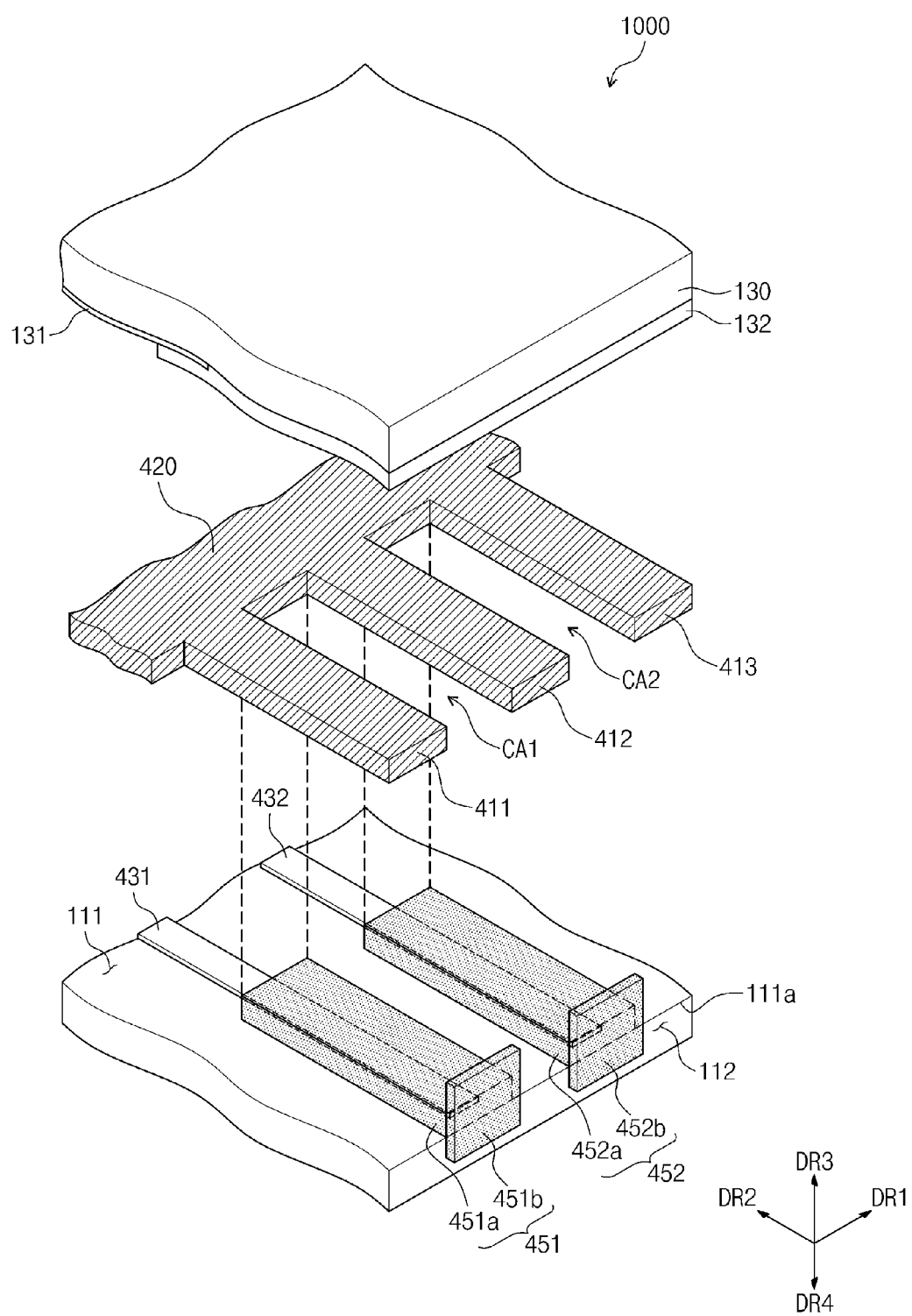

DISPLAY PANEL INCLUDING EXTERNAL CONDUCTIVE PAD, DISPLAY APPARATUS INCLUDING THE SAME AND METHOD OF MANUFACTURING THE SAME

This patent application claims priority to Korean Patent Application No. 10-2016-0071253, filed on Jun. 8, 2016, and all the benefits accruing therefrom under 35 U.S.C. § 119, the content of which in its entirety is herein incorporated by reference.

BACKGROUND

1. Field

The present disclosure relates to a display apparatus and a method of manufacturing the same. More particularly, the present disclosure relates to a display apparatus having a relatively thin bezel and a method of manufacturing the display apparatus having the relatively thin bezel.

2. Description of the Related Art

Various display apparatuses providing multimedia content, such as a television set, a mobile phone, a navigation display, a computer monitor, a game unit, etc., have been developed.

Each display apparatus includes a display panel which generates and displays an image and a controller which generates various signals to drive the display panel. The controller is implemented such as by an electronic circuit obtained by arranging electronic components on a printed circuit board.

SUMMARY

One or more exemplary embodiment provides a display apparatus having a relatively thin bezel.

One or more exemplary embodiment provides a method of manufacturing the display apparatus.

Exemplary embodiments of the invention provide a display apparatus including a first base substrate of a display panel of the display apparatus which generates an image with a signal provided thereto, the first base substrate defining: an outer edge thereof at which a substrate side surface of the first base substrate is exposed outside the display panel, and a substrate upper surface thereof connected to the outer edge thereof; first and second guiding dams disposed on the substrate upper surface and extending from an inside of the first base substrate to the outer edge thereof; a first signal line to which the signal is provided inside the display panel, the first signal line disposed on the substrate upper surface and extending between the first and second guiding dams in a direction from the inside of the first base substrate to the outer edge thereof; and a first side pad connected to the first signal line and through which the signal passes from outside the display panel to the first signal line. The first side pad includes a first horizontal portion disposed on the substrate upper surface, the first horizontal portion extending between the first and second guiding dams in the direction from the inside of the first base substrate to the outer edge thereof, in a top plan view, and the first horizontal portion extending to define a first vertical portion of the first side pad which is disposed on the substrate side surface exposed outside the display panel.

In the top plan view, the first signal line may include a distal end disposed between the first and second guiding dams and overlapped with the first horizontal portion.

The first and second guiding dams may be spaced apart from each other in a first direction, extend from the inside of the first base substrate to the outer edge thereof in a second direction crossing the first direction, and further extend to define a connection insulating portion extending in a first direction to connect the first and second guiding dams to each other.

In the top plan view, the first and second guiding dams and the connection insulating part may surround the first horizontal part and expose the first vertical portion.

The display apparatus may further include a second base substrate of the display panel which faces the first base substrate, and the first horizontal portion may be disposed between the first and second base substrates.

The first and second guiding dams may be arranged spaced apart from each other in a first direction and extend from the inside of the first base substrate to the outer edge thereof in a second direction crossing the first direction. The first vertical portion disposed on the substrate side surface exposed outside the display panel may extend in a third direction substantially vertical to the first and second directions and face the second base substrate in the second direction.

The display apparatus may further include a printed circuit board which provides the signal and an anisotropic conductive film interposed between the first vertical portion and the printed circuit board to connect the first vertical portion and the printed circuit board to each other.

The anisotropic conductive film may be overlapped with the first base substrate in the second direction.

The anisotropic conductive film may be spaced apart from the second base substrate in the third direction.

The display apparatus may further include an upper conductive layer disposed on a lower surface of the second base substrate and an insulating layer disposed between the upper conductive layer and the first horizontal portion.

The display apparatus may further include a third guiding dam disposed on the substrate upper surface and extending the inside of the first base substrate to the outer edge thereof; a second signal line to which the signal is provided inside the display panel, the second signal line disposed on the substrate upper surface and extending between the second and third guiding dams in the direction from the inside of the first base substrate to the outer edge thereof; and a second side pad connected to the second signal line and through which the signal passes from outside the display panel to the second signal line. The second side pad may include a second horizontal portion disposed on the substrate upper surface, the second horizontal portion extending between the second and third guiding dams in the direction from the inside of the first base substrate to the outer edge thereof, in the top plan view, and the second horizontal portion extending to define a second vertical portion of the second side pad which is disposed on the substrate side surface exposed outside the display panel.

Exemplary embodiments of the invention provide a method of manufacturing a display apparatus, including: forming a conductive material layer on a substrate upper surface of a first base substrate of a display panel which generates an image with a signal provided thereto, where the first base substrate defines an outer edge thereof at which a substrate side surface of the first base substrate is exposed outside the display panel, and a substrate upper surface thereof connected to the outer edge thereof; patterning the conductive material layer to form a first signal line to which the signal is provided inside the display panel; forming an insulating material layer on the first signal line on the substrate upper surface; patterning the insulating material layer to form first and second guiding dams on the substrate upper surface, the first and second guiding dams each extending in a direction from an inside of the first base substrate to the outer edge of the first base substrate to define a first conductive area therebetween which is open at the outer edge of the first base substrate; providing a conductive paste to the substrate side surface of the first base substrate which is exposed outside the display panel; and moving a first portion of the conductive paste on the substrate side surface into the first conductive area defined between the first and second guiding dams, to form a first horizontal portion of a first side pad which is connected to the first signal line at the first conductive area and through which the signal passes from outside the display panel to the first signal line.

The moving the first portion of the conductive paste may include using an adhesive force between the conductive paste and the first and second guiding dams.

The moving the first portion of the conductive paste may include disposing the first base substrate such that the first and second guiding dams are disposed to be parallel to a gravity direction, and the moving the first portion of the conductive paste may include using the adhesive force and the gravity.

An adhesive force within the material of the conductive paste may be smaller than the adhesive force between the conductive paste and the first and second guiding dams.

The providing the conductive paste may include: aligning a mask opening to be overlapped with the first conductive area, and coating the conductive paste on the mask. The first portion of the conductive paste is moved into the first conductive area through the opening.

The method may further include forming a vertical portion of the first side pad which extends from the horizontal portion thereof and is disposed on the substrate side surface.

The moving the first portion of the coated conductive paste into the first conductive area through the opening of the mask may dispose a second portion of the coated conductive paste different from the first portion thereof, remaining in the opening. The forming the vertical part may include curing the second portion of the conductive paste remaining in the opening.

The method may further include disposing an anisotropic conductive film between the vertical portion and a flexible printed circuit board through which the signal passes from outside the display panel to the first side pad, and thermo-compression bonding the anisotropic conductive film to connect the vertical portion to the flexible printed circuit board.

The patterning the conductive material layer may further form a second signal line to which the signal is provided inside the display panel. The patterning the insulating material may further form a third guiding dam on the substrate upper surface, the third guiding dam extending in the direction from the inside of the first base substrate to the outer edge of the first base substrate to define a second conductive area between the second and third guiding dams which is open at the outer edge of the first base substrate. The method may further include moving a third portion of the conductive paste on the substrate side surface to the second conductive area defined between the second and third guiding dams to form a second horizontal portion of a second side pad which is connected to the second signal line at the second conductive area and through which the signal passes from outside the display panel to the second signal line.

The moving the first portion of the coated conductive paste into the first conductive area may dispose a second portion of the coated conductive paste different from the first portion thereof, remaining on the substrate side surface of the first base substrate. The method may further include removing a portion of the second portion of the conductive paste remaining in the side surface area to form a vertical portion of the first side pad which extends from the first horizontal portion thereof and is disposed on the substrate side surface exposed outside the display panel.

The method may further include providing a second base substrate of the display panel to face the first base substrate, forming an upper conductive layer and an insulating layer on a lower surface of the second base substrate; and coupling the first and second base substrates to each other to dispose the upper conductive layer interposed between the first and second base substrates and the insulating layer interposed between the upper conductive layer and the first horizontal portion.

According to the above, the signal line of the display panel is connected to the flexible printed circuit board through the side pad having the vertical part disposed on the side surface of the base substrate. Accordingly, the pad area required to dispose the side pad on the display panel is reduced, and thus the bezel is reduced.

In addition, according to the manufacturing method of the display apparatus, since the conductive paste moves to the connection area defined between the guide dams, the horizontal part of the side pad may be easily formed. Thus, the process time, the process cost, and the yield of the manufacturing method of the display apparatus may be improved.

BRIEF DESCRIPTION OF THE DRAWINGS

The above and other advantages of the present disclosure will become readily apparent by reference to the following detailed description when considered in conjunction with the accompanying drawings where:

FIG. 2 is an enlarged exploded perspective view showing an area at which a display panel is connected to a flexible printed circuit board in the display apparatus shown in FIG. 1;

DETAILED DESCRIPTION

Figure 1:
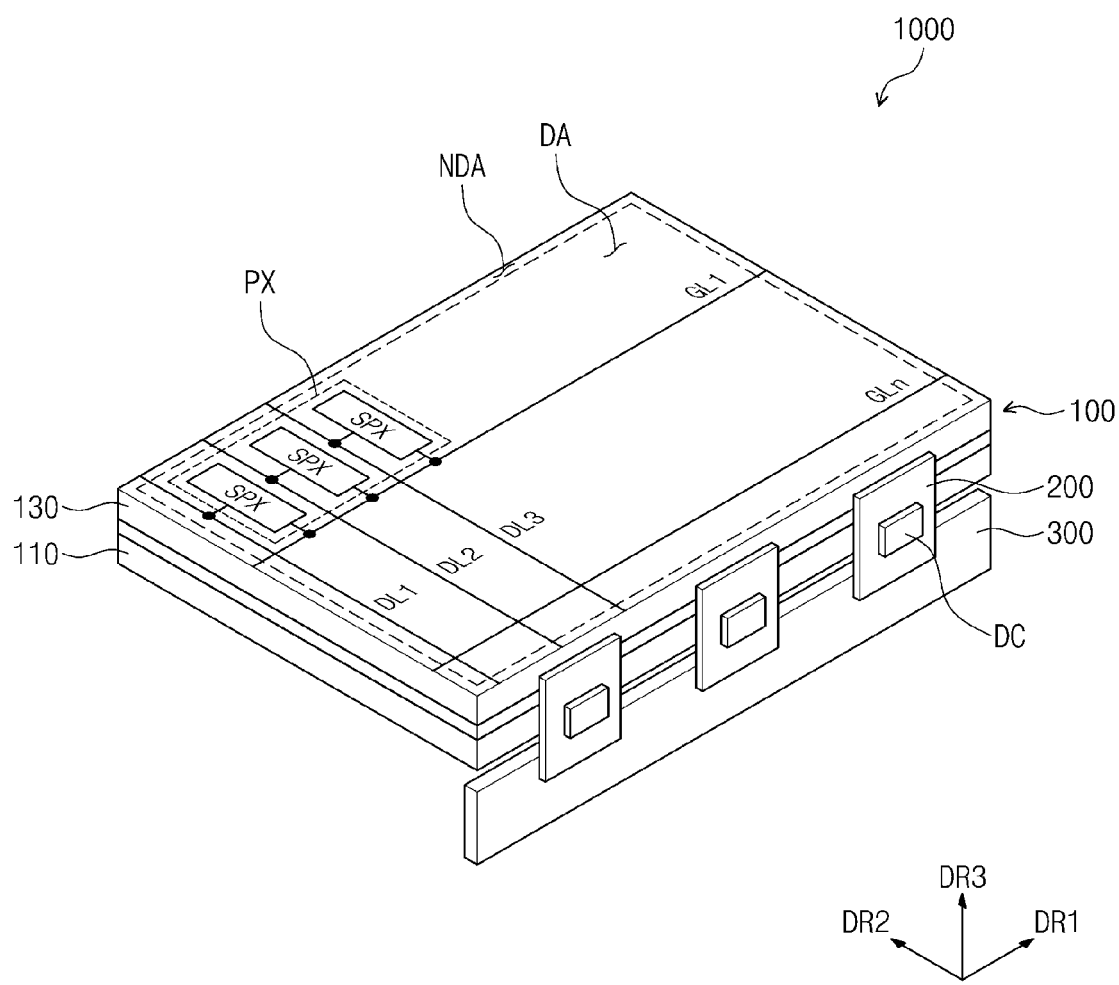
FIG. 1 is a perspective view showing an exemplary embodiment of a display apparatus according to the invention.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein car be made without departing from the scope and spirit of the present disclosure. In the drawings, the thickness of layers, films, and regions are exaggerated for clarity. Like numerals refer to like elements throughout.

The use of the terms first, second, etc. do not denote any order or importance, but rather the terms first, second, etc. are used to distinguish one element from another.

It is to be understood that the singular forms "a," "an," and "the" include plural referents unless the context clearly dictates otherwise. "At least one" is not to be construed as limiting "a" or "an." "Or" means "and/or." As used herein, the term "and/or" includes any and all combinations of one or more of the associated listed items.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. It will be understood that when an element is "connected" to another element, the elements may be physically, electrically and/or fluidly connected to each other.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the exemplary embodiments of the invention will be explained in detail with reference to the accompanying drawings.

A display panel of a display apparatus includes a pixel at which an image is displayed and a signal line which is connected to the pixel. The signal line applies a driving signal to the pixel to drive the pixel. An end, such as a distal end, of the signal line is connected to a flexible printed circuit board. The flexible printed circuit board is connected between the display panel and a printed circuit board as including or being a controller of the display apparatus. The signal line of the display panel receives the driving signal from the printed circuit board through the flexible printed circuit board.

FIG. 1 is a perspective view showing an exemplary embodiment of a display apparatus 1000 according to the invention.

Referring to FIG. 1, the display apparatus 1000 includes a display panel 100, a flexible printed circuit board 200 and a printed circuit board 300. The flexible printed circuit board 200 and/or the printed circuit board 300 may be provided in plural within the display apparatus 1000.

The display panel 100 generates and image and displays the image through a display area DA thereof. Components of the display panel 100 within the display area DA are operated by a control signal and image data generated by the printed circuit board 300, to generate and display the image.

The display panel 100 includes a gate line provided in plural including gate lines GL1 to GLn, a data line provided in plural including data lines DL1, DL2 and DL3 (up to DLm, not shown), and a sub-pixel SPX provided in plural, which are arranged in the display area DA. The gate lines GL1 to GLn define lengths thereof which extend in a first direction DR1 and the gate lines GL1 to GLn are arranged in a second direction DR2 crossing the first direction DR1. The data lines DL1 to DLm are insulated from the gate lines GL1 to GLn while crossing the gate lines GL1 to GLn. The data lines DL1 to DLm define lengths thereof which extend in the second direction DR2 and the data lines DL1 to DLm are arranged in the first direction DR1.

When viewed in a top plan view, the display panel 100 includes a non-display area NDA defined to surround the display area DA. The sub-pixels SPX are not arranged in the non-display area NDA, and the image is not displayed through the non-display area NDA. The non-display area NDA may correspond to a bezel of the display apparatus 1000. A dimension of the bezel of the display apparatus 1000 in the top plan view, may be defined by dimensions of the non-display area NDA taken in a plane defined by the first and second directions DR1 and DR2.

Each of the sub-pixels SPX is connected to a corresponding gate line among the gate lines GL1 to GLn and a corresponding data line among the data lines DL1 to DLm.

The sub-pixels SPX are arranged in a matrix form along the first and second directions DR1 and DR2, within the display area DA. Each sub-pixel SPX displays any one of primary colors, e.g., red, green and blue, but the colors displayed by the sub-pixels SPX should not be limited thereto or thereby. That is, the sub-pixels SPX may display secondary primary colors, e.g., yellow, cyan, magenta, etc., in addition to the red, green and blue primary colors.

A group of the sub-pixels SPX collectively form a pixel PX. Referring to FIG. 1, as an example, three sub-pixels SPX form one pixel PX, but the invention should not be limited thereto or thereby. That is, two or four or more sub-pixels SPX may form one pixel PX.

The pixel PX corresponds to an element of the display panel 1000 which uses light to generate and display a unit image within the overall image displayed by the display panel 100. A resolution of the display panel 100 is determined by the number of the pixels PX arranged in the display panel 100. FIG. 1 shows only one pixel PX, and the other pixels are omitted for convenience of description.

In exemplary embodiments, the display panel 100 may be, but not limited to, an organic light emitting display panel, and the sub-pixels SPX may include an organic light emitting element which generates light within the display panel 100. As another example, the display panel 100 may be a liquid crystal display panel, the sub-pixels SPX may include a liquid crystal layer which transmits or blocks light therethrough, and the display apparatus 1000 may include a backlight unit disposed at a rear side of the display panel 100 to generate light outside the display panel 100.

The display panel 100 may have a plate-like shape defined by a pair of long sides and a pair of short sides, which are respectively parallel to the first and second directions DR1 and DR2. The display panel 100 may be disposed in the plane defined by the first and second directions DR1 and DR2, such as to be flat in such plane, but the invention is not limited thereto. In exemplary embodiments, the display panel 100 may have various shapes such as having a shape curved along at least one direction in a cross-sectional view thereof or have at least one rounded edge when viewed in the top plan view.

The display panel 100 includes a first base substrate 110 and a second base substrate 130. The second base substrate 130 faces the first base substrate 110 and is disposed on the first base substrate 110. The liquid crystal layer or the organic light emitting element may be disposed between the first and second base substrates 110 and 130. The first and second base substrates 110 and 130 may each define an upper surface thereof, a lower surface thereof opposite to the upper surface, and side surfaces which connect the upper and lower surfaces to each other. Respective layers disposed on the first and second base substrates 110 and 130 may be included in a collective first display substrate and a collective second display substrate, respectively.

The flexible printed circuit board 200 connects the display panel 100 and the printed circuit board 300 to each other. In an exemplary embodiment, the flexible printed circuit board 200 faces the side surface of the display panel 100. In more detail, the flexible printed circuit board 200 faces side surfaces of the first and second base substrates 110 and 130.

The flexible printed circuit board 200 is overlapped with the first and second base substrates 110 and 130 in the second direction DR2 and not overlapped with the first and second base substrates 110 and 130 in a vertical direction. Where the first and second base substrates 110 and 130 are each disposed in different planes from each other, the flexible printed circuit board 200 is overlapped with both of the different planes, such that the flexible printed circuit board 200 is considered overlapped with the first and second base substrates 110 and 130 in the second direction DR2. Other elements of the display apparatus 1000 may overlap each other in the second direction DR2, in a similar manner as described above. The vertical direction may be a third direction DR3 substantially perpendicular to the first and second directions DR1 and DR2. In other words, the flexible printed circuit board 200 may not interposed between the first and second base substrates 110 and 130 and may not overlap either of the first and second base substrates 110 and 130 in the top plan view.

In exemplary embodiments, the flexible printed circuit board 200 is provided in a plural number, and the flexible printed circuit boards 200 are arranged along a side of the display panel 100, such as along one long side among the long sides extended in the first direction DR1. The number of the flexible printed circuit boards 200 should not be limited to a specific value.

As an exemplary embodiment, the flexible printed circuit board 200 may include a driving chip DC. The driving chip DC may be implemented by a tape carrier package and may include a chip in which a data driver (not shown) is implemented. The driving chip DC may further include a chip in which a gate driver is implemented. In addition, the gate driver may be disposed in the non-display area NDA of the display panel 100 instead of in a driving chip DC.

The printed circuit board 300 includes a controller. The controller generates and/or receives input image signals and converts a data format of the input image signals to a data format appropriate to an interface and a driving mode of the data driver, the gate driver and the display panel 100, to generate the image data. The controller outputs the image data and the control signal, such that the printed circuit board 300 may output the image data and the control signal. The image data output by the printed circuit board 300 includes information for the image displayed in the display area DA of the display panel 100.

The data driver at the flexible printed circuit board 200 receives the image data and the control signal from the printed circuit board 300. The data driver converts the image data to data voltages in response to the control signal and applies the data voltages to the data lines DL1 to DLm of the display panel 100. The data voltages may be analog voltages corresponding to the image data.

Various electronic components may be mounted on the printed circuit board 300 to implement the controller. In an exemplary embodiment, for instance, the printed circuit board 300 may include passive components, e.g., a capacitor, a resistor, etc., active components, e.g., a micro-processor including an integrated circuit, a memory chip, etc., and conductive lines connecting the passive components and the active components to each other.

FIG. 2 is an enlarged exploded perspective view showing an area at which a display panel is connected to a flexible printed circuit board in the display apparatus shown in FIG. 1.

Referring to FIG. 2, the display apparatus 1000 includes a plurality of guiding dams, a plurality of signal lines and a plurality of side pads.

For the convenience of explanation, FIG. 2 shows first, second and third guiding dams 411, 412 and 413 among the guiding dams, first and second signal lines 431 and 432 among the signal lines, and first and second side pads 451 and 452 among the side pads.

In an exemplary embodiment, the first to third guiding dams 411 to 413 are disposed on a substrate upper surface 111 of the first base substrate 110. The lengths of the first to third guiding dams 411 to 413 extend to an inner side of the substrate upper surface 111 from an (outer) edge 111a of the substrate upper surface 111. The first to third guiding dams 411 to 413 define lengths thereof which extend in the second direction DR2 and the first to third guiding dams 411 to 413 are arranged in the first direction DR1 at regular intervals.

In exemplary embodiments, the display apparatus 1000 may further include a connection insulating part 420 disposed on the first base substrate 110. The connection insulating part 420 may define a length thereof which extends in the first direction DR1. In an exemplary embodiment, the connection insulating part 420 may be connected to an inner end of the first to third guiding dams 411 to 413 which is distal relative to the edge 111a of the substrate upper surface 111. The connection insulating part 420 may be integrally disposed or formed with the first to third guide dams 411 to 413. That is, the connection insulating part 420 and the first to third guide dams 411 to 413 may be disposed as a single, unitary member. Stated in another way, one among the connection insulating part 420 and the first to third guide dams 411 to 413 may extend to define one or all of the remaining among the connection insulating part 420 and the first to third guide dams 411 to 413.

A first connection area CA1 is defined between the first and second guiding dams 411 and 412, and a second connection area CA2 is defined between the second and third guiding dams 412 and 413. The first and second connection areas CA1 and CA2 may alternate with the first to third guide dams 411 to 413 in the first direction DR1.

The first side pad 451 includes a first horizontal portion 451a and a first vertical portion 451b.

The first horizontal portion 451a is disposed between the first and second guiding dams 411 and 412, in a top plan view. In more detail, the first horizontal portion 451a is disposed on the upper surface 111 to correspond to the first connection area CA1. The first horizontal portion 451a defines a length thereof which extends in the second direction DR2. The first horizontal portion 451a is disposed between the first and second base substrates 110 and 130 in a cross-sectional (e.g., thickness) direction like the third direction DR3.

The first vertical portion 451b extends from an outer end of the first horizontal part 451a which is adjacent to the edge 111a of the substrate upper surface 111 and is disposed on a substrate side surface 112 of the first base substrate 110 connected to the edge 111a of the substrate upper surface 111. In more detail, a lower end of the first vertical portion 451b extends in a fourth direction DR4 opposite to the third direction DR3 and is overlapped with the first base substrate 110 in the second direction DR2. In addition, an upper end of the first vertical portion 451b extends in the third direction DR3 and is overlapped with the second base substrate 130 in the second direction DR2.

In an exemplary embodiment, the first vertical portion 451b may be integrally provided with the first horizontal portion 451a and may not be interposed between the first and second base substrates 110 and 130. That is, the first vertical portion 451b and the first horizontal portion 451a may be disposed as a single, unitary member. Stated in another way, one among the first vertical portion 451b and the first horizontal portion 451a may extend to define the other one among the first vertical portion 451b and the first horizontal portion 451a.

The second side pad 452 includes a second horizontal portion 452a and a second vertical portion 452b. The second side part 452 is disposed spaced apart from the first side pad 451 in the first direction DR1. The second guiding dam 412 is interposed between the first and second side pads 451 and 452.

The second horizontal portion 452a has the same shape as that of the first horizontal portion 451a, the second vertical portion 452b has the same shape as the first vertical portion 451b, and the connection relationship between the second horizontal portion 452a and the second vertical portion 452b is substantially the same as that between the first horizontal portion 451a and the first vertical portion 451b. Thus, further details of the shape and connection relationship of the second horizontal portion 452a and the second vertical portion 452b will be omitted.

The first and second side pads 451 and 452 have a conductivity and include a conductive material. In an exemplary embodiment, the conductive material may include Ag, Mg, Al, Pt, Pd, Au, Ni, Nd, Ir, Cr, Li, Ca, LiF/Ca, LiF/Al, Mo, Ti, a compound thereof, or a combination thereof (e.g., a combination of Ag and Mg). In addition, the conductive material may include a conductive polymer, a transparent metal oxide, a graphene, metal nanowire or a combination thereof.

The first and second signal lines 431 and 432 may be the first and second data lines DL1 and DL2 (refer to FIG. 1). The first and second signal lines 431 and 432 define lengths thereof which extend in the second direction DR2 on the substrate upper surface 111. As another example, the first and second signal lines 431 and 432 may be two gate lines among the gate lines GL1 to GLn (refer to FIG. 1).

The first signal line 431 is connected to the first side pad 451. In an exemplary embodiment, a distal first end 431a of the first signal line 431 extends in the length direction of the first signal line 431 to the edge 111a and is disposed in the first connection area CA1. The distal first end 431a is overlapped with the first horizontal portion 451a in the third direction DR3 and is connected to the first horizontal portion 451a.

In an exemplary embodiment, the first signal line 431 may be disposed between the first horizontal portion 451a and the first base substrate 110.

The second signal line 432 is disposed spaced apart from the first signal line 431 in the first direction DR1. The second guiding dam 412 is interposed between the first and second signal lines 431 and 432.

The second signal line 432 is connected to the second side pad 452. In an exemplary embodiment, a distal second end 432a of the second signal line 432 extends in the length direction of the second signal line 432 to the edge 111a and is disposed in the second connection area CA2. The distal second end 432a is overlapped with the second horizontal portion 452a in the third direction DR3 and connected to the second horizontal portion 452a.

In an exemplary embodiment, the second signal line 432 may be disposed between the second horizontal portion 452a and the first base substrate 110.

Figure 3A:
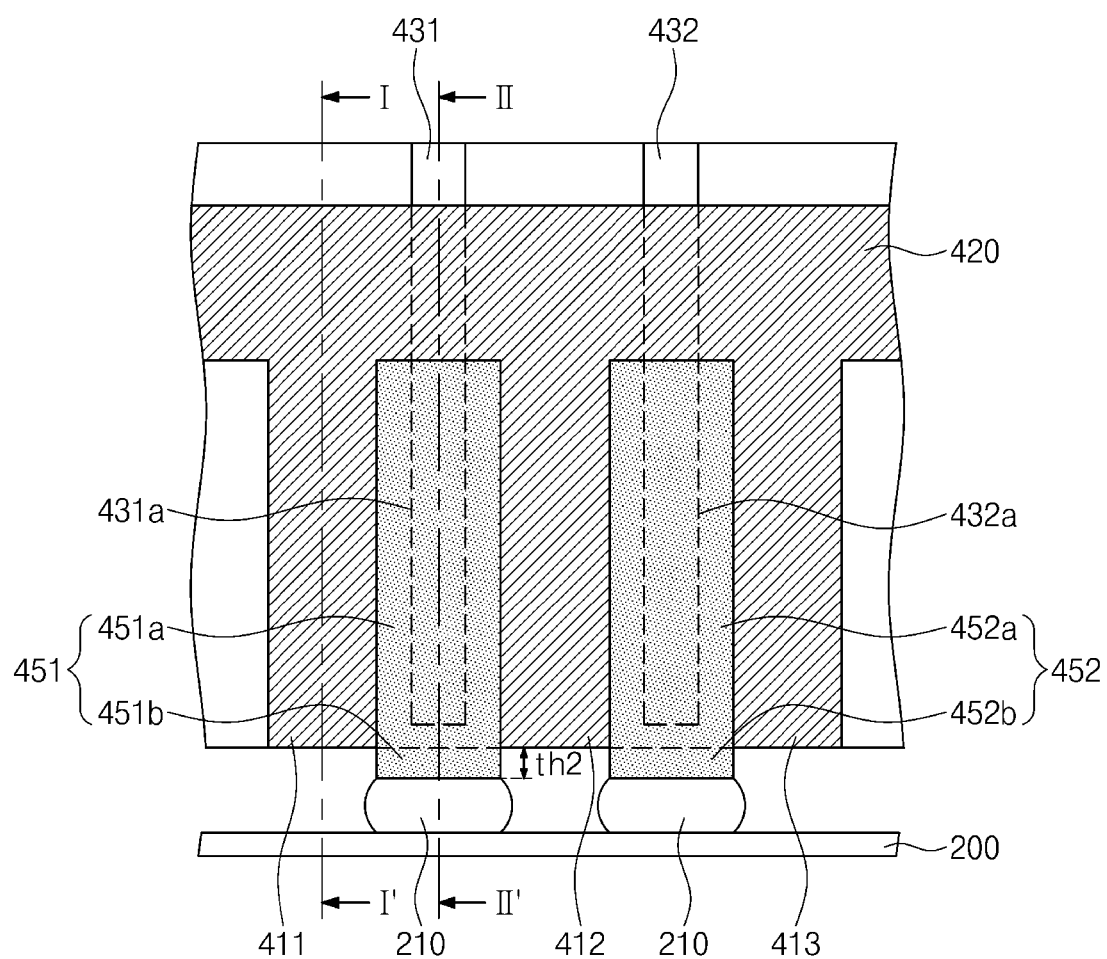
FIG. 3A is a top plan view showing an exemplary embodiment of an assembled state of the display apparatus shown in FIG. 2.
Figure 3B:
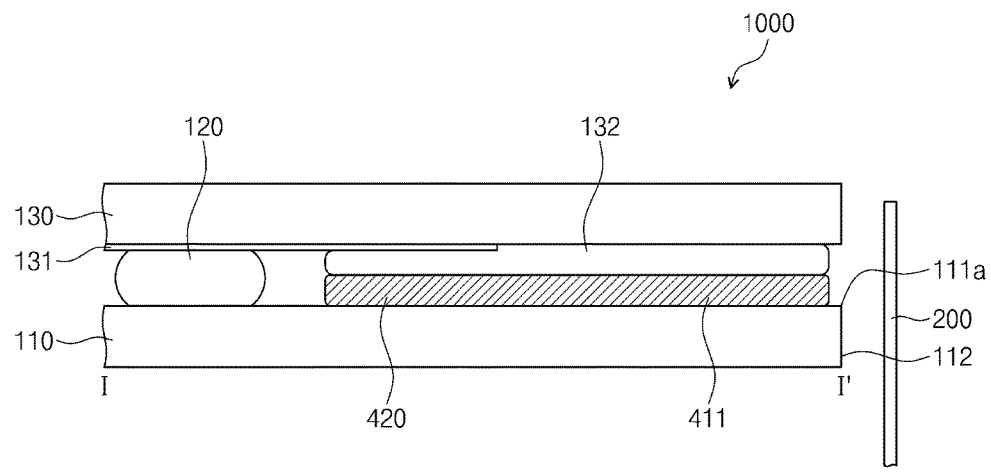
FIGS. 3B and 3C are cross-sectional views respectively taken along lines I-I' and II-II' shown in FIG. 3A.
Figure 3C:
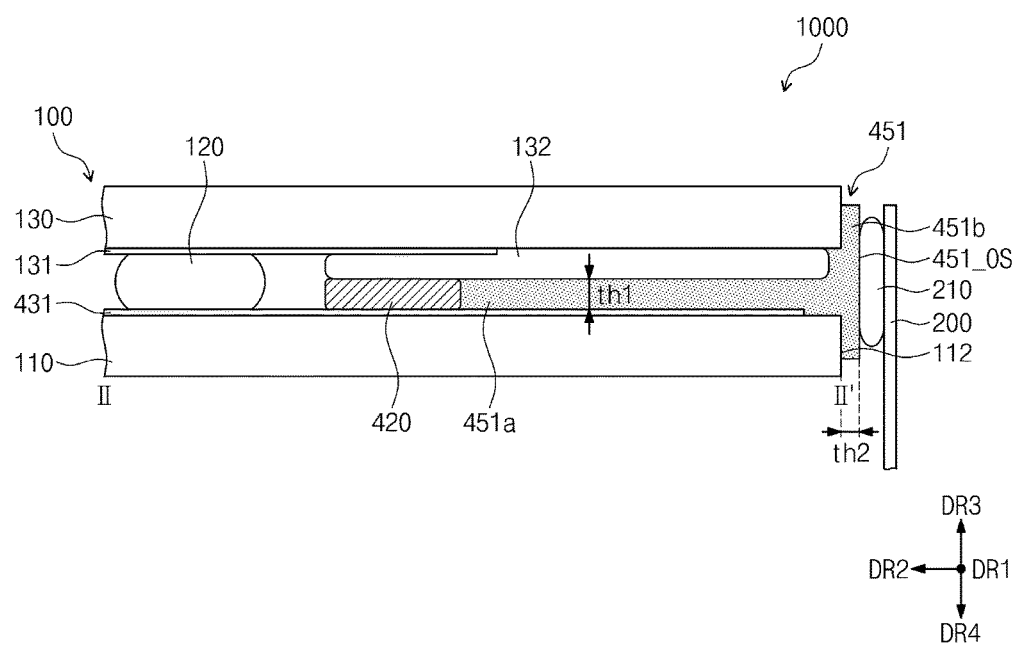

FIG. 3A is a top plan view showing an exemplary embodiment of an assembled state of the display apparatus shown in FIG. 2, and FIGS. 3B and 3C are cross-sectional views respectively taken along lines I-I' and II-II' shown in FIG. 3A.

The first and second side pads 451 and 452 have the similar structure and function, and thus, hereinafter, only the first side pad 451 will be described with reference to FIGS. 3A to 3C, and detailed descriptions of the second side pad 452 will be omitted.

The first horizontal part 451a, the connection insulating portion 420 and the first and second guiding dams 411 and 412 may each define an upper surface thereof, a lower surface thereof opposite to the upper surface, and side surfaces which connect the upper and lower surfaces to each other.

Referring to FIGS. 3A to 3C, among side surfaces of the first and second guiding dams 411 and 412, side surfaces thereof facing the first horizontal portion 451a may make contact with side surfaces of the first horizontal portion 451a. In addition, among side surfaces of the connection insulating part 420, side surfaces thereof facing the first horizontal portion 451a may make contact with side surfaces of the first horizontal portion 451a. When viewed in the top plan view, the first and second guiding dams 411 and 412 and the connection insulating part 420 surround a distal end of the first horizontal portion 451a. In the illustrated exemplary embodiment, the first and second guiding dams 411 and 412 and the connection insulating portion 420 exposes the first vertical portion 451b when viewed in the top plan view. In other words, the first and second guiding dams 411 and 412 and the connection insulating part 420 do not surround the first vertical portion 451b.

The display apparatus 1000 may further include an upper conductive layer 131 and an insulating layer 132 disposed on a lower surface of the second base substrate 130 which faces the first base substrate 110. The upper conductive layer 131 may be, but not limited to, a common electrode disposed or formed on an entirety of the lower surface of the second base substrate 130. The upper conductive layer 131 may include Li, Ca, LiF/Ca, LiF/Al, Al, Mg, BaF, Ba, Ag, a compound thereof, or a combination thereof (e.g., a combination of Ag and Mg), or a transparent metal oxide, e.g., indium tin oxide ("ITO"), indium zinc oxide ("IZO"), zinc oxide ("ZnO"), indium tin zinc oxide ("ITZO"), etc.

At least a portion of the upper conductive layer 131 is disposed between the insulating layer 132 and the second base substrate 130. At least the portion of the upper conductive layer 131 faces the first horizontal portion 451a such that the insulating layer 132 is disposed between the upper conductive layer 131 and the first horizontal portion 451a.

In an exemplary embodiment, the insulating layer 132 is disposed on the connection insulating portion 420, the first to third guiding dams 411 to 413, and the first and second horizontal portions 451a and 452a. At least a portion of the insulating layer 132 is disposed between the first horizontal portion 451a and the upper conductive layer 131 to insulate the first horizontal portion 451a from the upper conductive layer 131. The insulating layer 132 has a single-layer structure of an organic layer or an inorganic layer or a multi-layer structure of the organic layer and/or the inorganic layer.

A portion of a lower surface of the insulating layer 132 defines a boundary or edge of the first connection area CA1. An upper surface of the horizontal portion 451a makes contact with the portion of the lower surface of the insulating layer 132 which defines the boundary or edge of the first connection area CA1. In an exemplary embodiment, the first horizontal portion 451a has a first thickness th1 corresponding to a total or maximum distance between a lower surface of the first horizontal portion 451a and the lower surface of the insulating layer 132.

As described above, the lower end of the first vertical portion 451b extends in the fourth direction DR4 and is overlapped with the first base substrate 110 in the second direction DR2. In addition, the upper end of the first vertical portion 451b extends in the third direction DR3 and is overlapped with the insulating layer 132 and the second base substrate 130 in the second direction DR2.

In an exemplary embodiment, the first vertical portion 451b has a second thickness th2. The second thickness th2 corresponds to a distance between the substrate side surface 112 and an outer side surface 451_OS of the first vertical portion 451b.

In an exemplary embodiment, the flexible printed circuit board 200 is overlapped with the first vertical part 451b in the second direction DR2. In more detail, the outer side surface 451_OS of the first vertical portion 451b faces a lower surface of a first end (in the third direction DR3 of FIG. 3C) of the flexible printed circuit board 200.

In an exemplary embodiment, the display apparatus 1000 further includes an anisotropic conductive film 210. The anisotropic conductive film 210 is disposed between the outer side surface 451_OS of the first vertical portion 451b and the lower surface of the one end of the flexible printed circuit board 200 to connect the first vertical portion 451b and the flexible printed circuit board 200 to each other. Accordingly, the first signal line 431 is connected to the flexible printed circuit board 200 through the first side pad 451. The anisotropic conductive film 210 includes an adhesive resin and a conductive member therein such as a plurality of conductive balls distributed in the adhesive resin.

In an exemplary embodiment, the flexible printed circuit board 200 may be curved (not shown) from the substrate side surface 112 such that a second end (in the fourth direction DR4 in FIG. 3C) opposite to the first end of the flexible printed circuit board 200 faces a rear surface of the first base substrate 110 (e.g., furthest surface of the first base substrate 110 in the fourth direction DR4 in FIG. 3C).

In an exemplary embodiment, the anisotropic conductive film 210 may be disposed on the entire surface of the outer side surface 451_OS of the first vertical portion 451b. Where the anisotropic conductive film 210 is on the entire surface of the outer side surface 451_OS, the anisotropic conductive film 210 may be overlapped with the first base substrate 110, the first horizontal portion 451a, the insulating layer 132 and the second base substrate 130 in the second direction DR2. Accordingly, a contact area between the anisotropic conductive film 210 and the first vertical portion 451b increases, and thus a process margin is obtained to connect the anisotropic conductive film 210 and the flexible printed circuit board 200 to each other.

In an exemplary embodiment, the display apparatus 1000 may further include a sealing member 120. The sealing member 120 is disposed between the first and second base substrates 110 and 130 and provided along an edge of the first and second base substrates 110 and 130. The sealing member 120 couples the first and second base substrates 110 and 130 to each other. In an exemplary embodiment, the sealing member 120 includes a material having an adhesive property. The sealing member 120 is spaced apart from the connection insulating part 420 and the insulating layer 132 in the second direction DR2.

As described above, the flexible printed circuit board 200 disposed outside of a planar area of the display panel 100 is connected to the first and second signal lines 431 and 432 disposed inside the planar area of the display panel 100 through the first and second side pads 451 and 452, respectively. Since a portion of the first and second side pads 451 and 452 and the flexible printed circuit board 200 are each outside the planar area of display panel 100 and facing the side surface (e.g., 112) of the display panel 100, these portions do not contribute to a planar area (e.g., in a plane defined in the first and second directions DR1 and DR2) of a pad area inside the planar area of the display panel 100 at which the flexible printed circuit board 200 and the display panel 100 are connected to each other. Thus, the pad area required to connect the flexible printed circuit board 200 and the first and second signal lines 431 and 432 of the display panel 100 to teach other may be reduced. As a result, the bezel of the display apparatus 1000 may become relatively thin. That is, a dimension of the bezel in the plane defined in the first and second directions DR1 and DR2 and inside the planar area of the display panel 100 may be reduced.

The first to third guiding dams 411 to 413 insulate the first and second side pads 451 and 452 from each other, and thus an electrical short between the first and second signal lines 431 and 432 may be reduced or effectively prevented. In addition, since the first and second signal lines 431 and 432 are respectively overlapped with the first and second side pads 451 and 452 in the third direction DR3 and connected to the first and second side pads 451 and 452 over a relatively large area, the first and second signal lines 431 and 432 are effectively connected to the first and second side pads 451 and 452, and a connection electrical impedance between the first and second signal lines 431 and 432 and the first and second side pads 451 and 452 may be controlled and improved.

In addition, in a method of manufacturing a display apparatus, since the first and second side pads 451 and 452 are relatively easily formed by using the first to third guiding dams 411 to 413 as described below, a process time, a process cost and a yield of the manufacturing method of the display apparatus 1000 may be improved.

Figure 4:
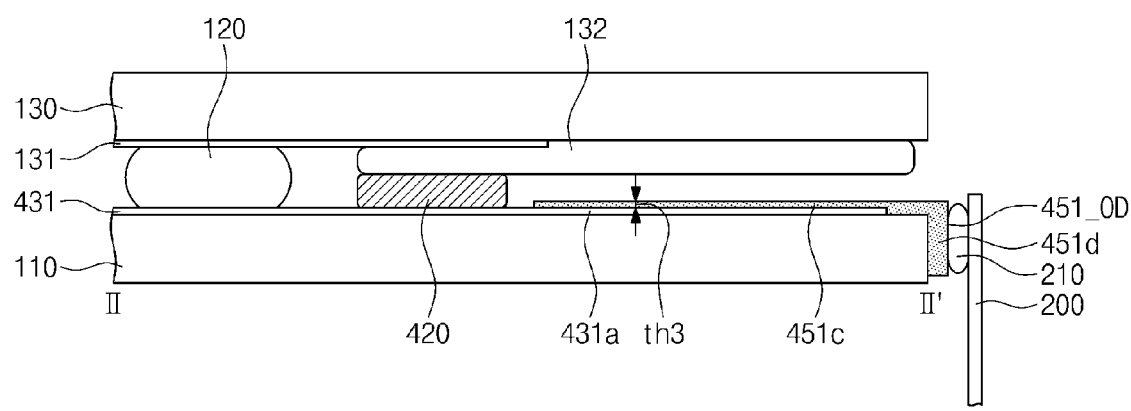
FIG. 4 is a cross-sectional view showing another exemplary embodiment of a display apparatus according to the invention.

FIG. 4 is a cross-sectional view showing another exemplary embodiment of a display apparatus according to the invention.

The cross-sectional view shown in FIG. 4 corresponds to the cross-sectional view taken along the line II-II' shown in FIG. 3A and has a same directionality orientation as FIG. 3C. Referring to FIG. 4, for a first side pad (e.g., 451 in FIG. 2) a first horizontal portion 451c may not contact with the connection insulating part 420 and/or the insulating layer 132. Where the first horizontal portion 451c is spaced apart from the connection insulating part 420 and/or the insulating layer 132, the first horizontal portion 451c has a third thickness th3 smaller than the first thickness th1 and a thickness of the first connection area CA1 (refer to FIG. 3C) in the third direction DR3.

For the first side pad including the first horizontal portion 451c described above, a first vertical portion 451d is disposed only on the substrate side surface 112 (e.g., in a plane of the first base substrate 110) and not overlapped with the insulating layer 132 and the second base substrate 130 in the second direction DR2 (e.g., not in planes of the insulating layer 132 and the second base substrate 130).

In an exemplary embodiment, the anisotropic conductive film 210 may be disposed on an entire outer side surface 451_OD of the first vertical portion 451d of the first side pad. In this case, the anisotropic conductive film 210 is overlapped with the first base substrate 110 in the second direction DR2 and not overlapped with the insulating layer 132 and the second base substrate 130 in the second direction DR2.

In the illustrated exemplary embodiment, the first horizontal portion 451c of the first side pad may disposed on (e.g., above in the third direction DR3) the distal first end 431a of the first signal line 431, but it should not be limited thereto or thereby. In an alternative exemplary embodiment, the first horizontal portion 451c may be interposed between the distal first end 431a of the first signal line 321 and the first base substrate 110.

FIGS. 5A to 5H are perspective views explaining an exemplary embodiment of processes in a method of manufacturing a display apparatus according to the invention. The structure of FIGS. 5A to 5H is taken with reference to FIGS. 1 and 2 described above.

Figure 5A:
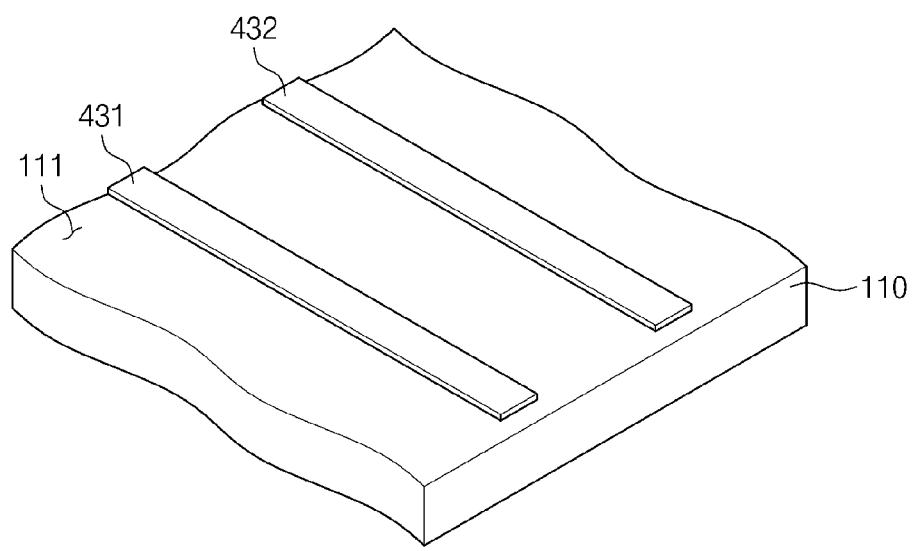
FIGS. 5A to 5H are perspective and top plan views explaining an exemplary embodiment of a method of manufacturing a display apparatus according to the invention.

Referring to FIGS. 1, 2 and 5A, for forming a first display substrate, the first and second signal lines 431 and 432 are formed on the substrate upper surface 111 of the first base substrate 110. In an exemplary embodiment, the first and second signal lines 431 and 432 are formed by forming a conductive material layer on the entire surface of the first base substrate 110 and patterning the conductive material layer. The conductive material layer includes the above-mentioned conductive materials. In an exemplary embodiment, the conductive layer is patterned by a photolithography process.

In an exemplary embodiment, among layers of the first display substrate disposed on the first base substrate 110, the first and second signal lines 431 and 432 are disposed in a same layer as a layer in which a drain electrode or a gate electrode of a driving transistor driving the sub-pixel SPX (refer to FIG. 1) is disposed. The first and second signal lines 431 and 432 may be formed together with the drain electrode and the gate electrode without a separate additional process during a patterning process performed to form the drain electrode and the gate electrode.

Figure 5B:
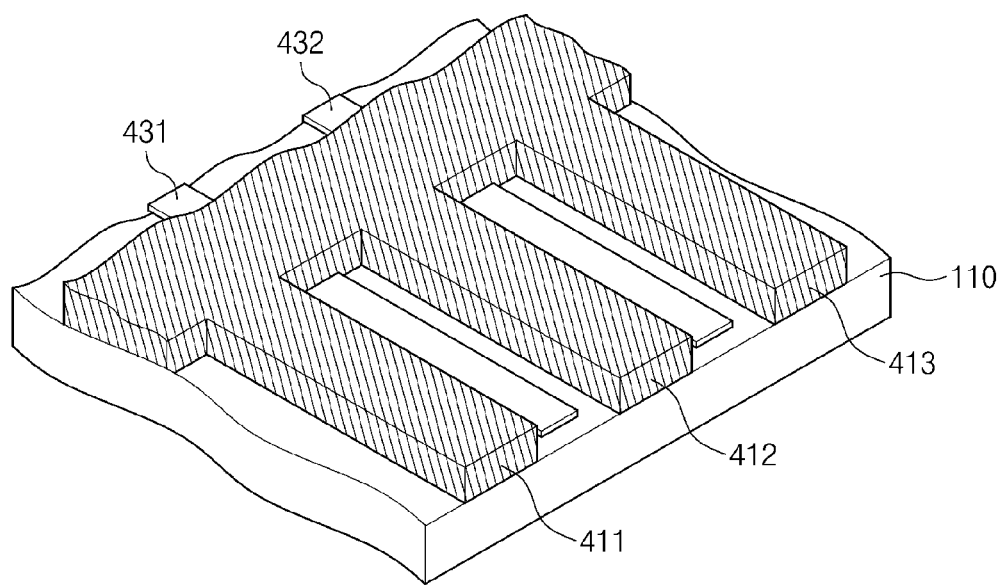

As shown in FIG. 5B, the first to third guiding dams 411 to 413 and the connection insulating part 420 are formed on the first base substrate 110. The first to third guiding dams 411 to 413 and the connection insulating part 420 are formed by forming an insulating material layer on the entire surface of the first base substrate 110 having the first and second signal lines 431 and 432 thereon, and patterning the insulating material layer. The insulating material layer includes any of a number of insulating materials suitable for the purpose described herein. In an exemplary embodiment, the insulating material layer is patterned by a photolithography process.

In an exemplary embodiment, among layers of the first display substrate disposed on the first base substrate 110, the first to third guiding dams 411 to 413 may be disposed in the same layer as a layer in which a gate insulating layer of the driving transistor driving the sub-pixel SPX is disposed (refer to FIG. 1 or an intermediate insulating layer interposed between the driving transistor and a pixel electrode of the sub-pixel SPX). In an exemplary embodiment, the first to third guiding dams 411 and 413 may be formed together with the gate insulating layer or the intermediate insulating layer without a separate additional process during a patterning process performed to form the gate insulating layer or the intermediate insulating layer.

Figure 5C:
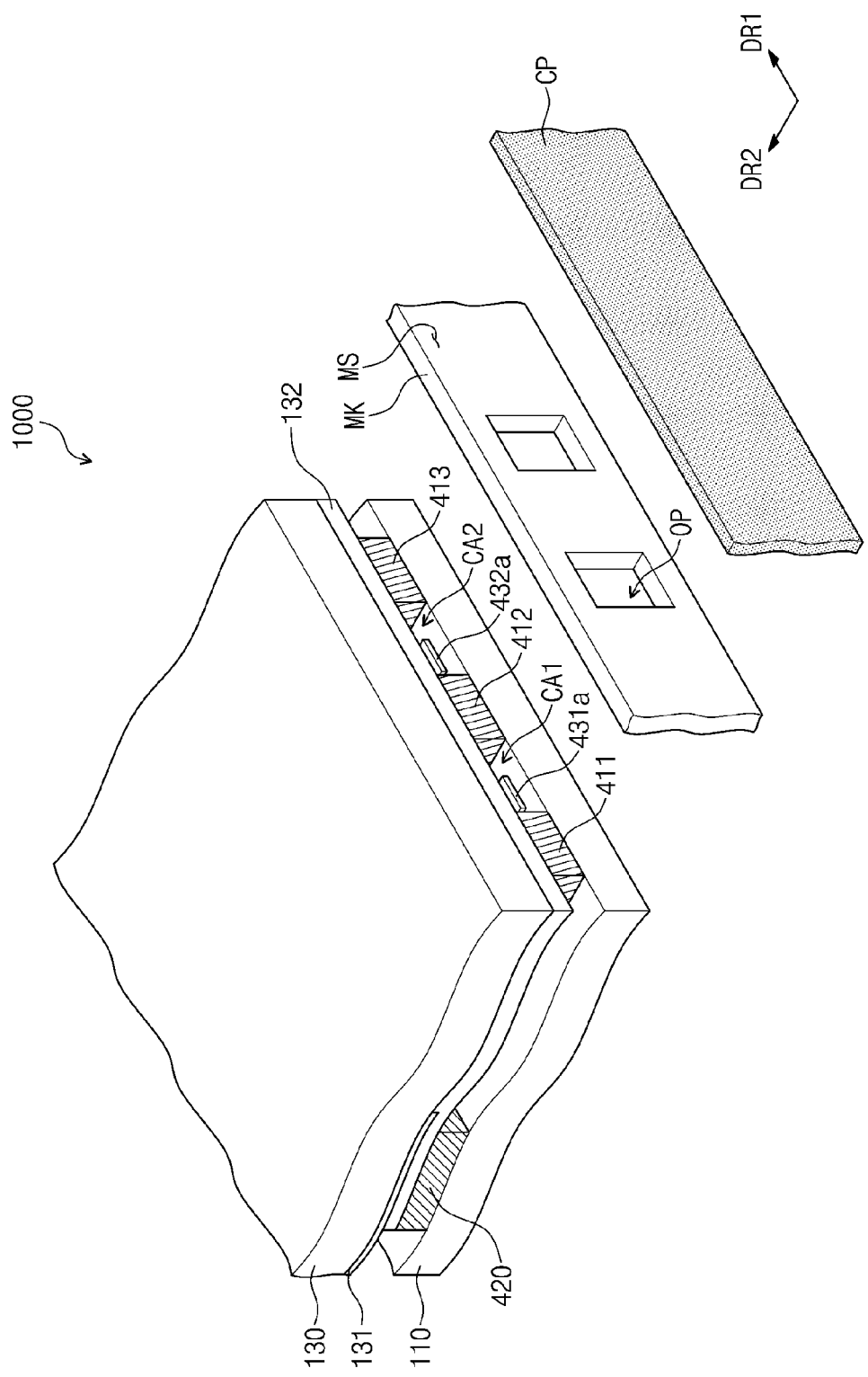

Referring to FIG. 5C, the second base substrate 130 such as having layers (e.g., 131, 132, etc.) of a second display substrate thereon, is coupled to the first base substrate 110 having the layers of the first display substrate thereon. Side surfaces of the first and second base substrates 110 and 130 at outer edges thereof, area exposed outside the first and second base substrates 110 and 130. With the second base substrate 130 coupled to the first base substrate 110 and outer side surfaces thereof exposed, a mask MK is aligned with the exposed side surfaces of the first and second base substrates 110 and 130, such as being disposed overlapping planes of the first and second base substrates 110 and 130.

Although not shown in figures, the upper conductive layer 131 and the insulating layer 132 are formed on a lower surface of the second base substrate 130 as layers of the collective second display substrate.

The mask MK includes an opening OP provided in plural (otherwise referred to as "a plurality of openings OP") defined therethrough and arranged in the first direction DR1. In an exemplary embodiment, the mask MK is aligned such that the openings OP of the mask MK respectively correspond to the first and second connection areas CA1 and CA2. Where the mask MK is aligned as described above, the openings OP are overlapped with the first and second connection areas CA1 and CA2 in the second direction DR2. That is, the openings OP are disposed in a same plane as the first and second connection areas CA1 and CA2 (e.g., the plane of 420, 411, 412 and 413).

In an exemplary embodiment, an inner side surface of the mask MK may make contact with the first and second base substrates 110 and 130. That is, the innermost side surface of the mask MK in the second direction DR2 may make contact with the exposed outer side surfaces of the first and second base substrates 110 and 130. With the mask MK in contact with the first and second base substrates 110 and 130, a space may be formed around the first and second signal lines 431 and 432 at the first and second connection areas CA1 and CA2. The space may be defined by side surfaces of the connection insulating portion 420 and the first to third guiding dams 411 to 413, a lower surface of the insulating layer 132 and an upper surface of the first base substrate 110, but the invention is not limited thereto.

A conductive paste CP is provided onto an entire surface of an outer side surface MS of the mask MK which is opposite to the inner side surface thereof. The conductive paste CP includes a conductive material and has fluidity and viscosity. The conductive paste CP is uniformly coated on the outer side surface MS of the mask MK.

Figure 5D:
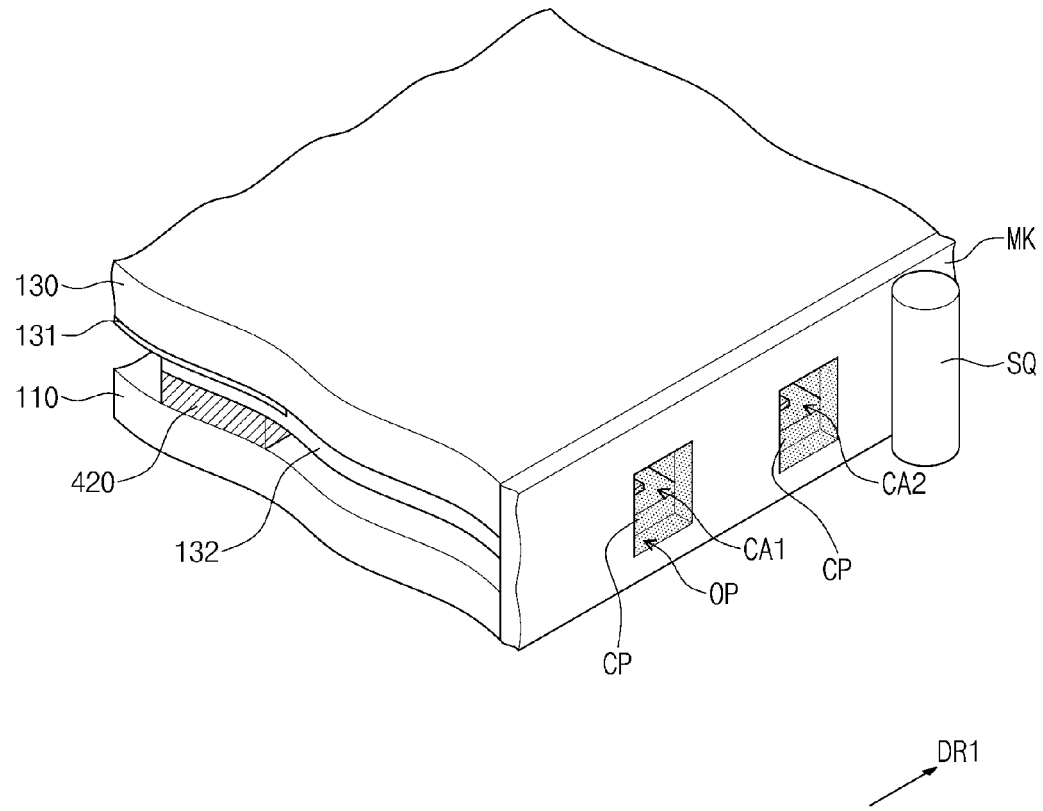

Referring to FIG. 5D, with the mask MK in contact with the first and second base substrates 110 and 130, the conductive paste CP provided onto the entire surface of the outer side surface MS of the mask MK is inserted into the first and second connection areas CA1 and CA2 through the openings OP of the mask MK. In an exemplary embodiment, the conductive paste CP may be moved from the outer side surface MS into the openings OP by a squeezer SQ to allow the conductive paste CP to be effectively inserted into the first and second connection areas CA1 and CA2 from the outer side surface MS. The squeezer SQ may move along the first direction DR1 and/or a direction opposite thereto, while moving the conductive paste CP along the outer side surface MS.

Figure 5E:
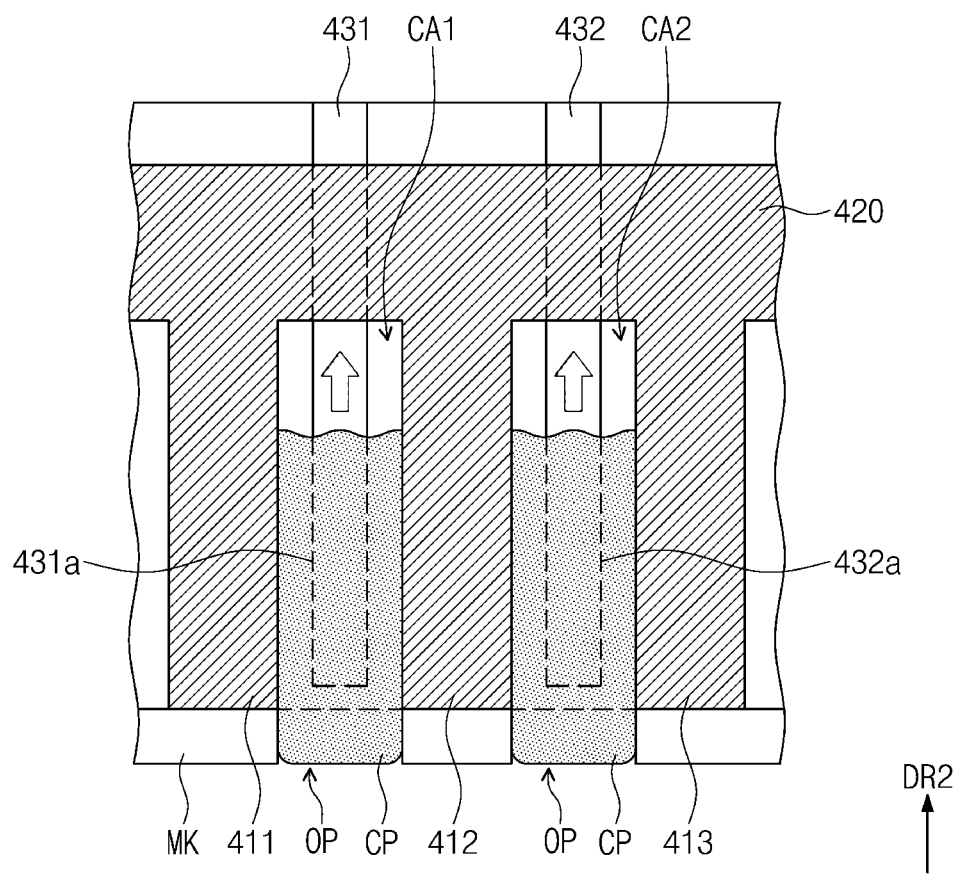

Referring to FIG. 5E, the conductive paste CP inserted into the first and second connection areas CA1 and CA2 from outside the first and second base substrates 110 and 130 moves along the space defined at the first and second connection areas CA1 and CA2. In an exemplary embodiment, the conductive paste CP moves along the second direction DR2 (indicated by open arrows in FIG. 5E). Accordingly, the conductive paste CP makes contact with and is connected to the distal first and second ends 431a and 431b of the first and second signal lines 431 and 432. The moving conductive paste CP is guided by sidewalls of the first to third guiding dams 411 to 413. A side surface of the connection insulating portion 420 at the innermost side of the first and second connection areas CA1 and CA2 restricts movement of the conductive paste CP in the second direction DR2 to reduce or effectively prevent the conductive paste CP from entering the inside of the first base substrate 110 past the connection insulating portion 420. In an exemplary embodiment, with the movement of the conductive paste in the second direction DR2 within the space at the first and second connection areas CA1 and CA2, the space at the first and second connection areas CA1 and CA2 may be filled with the conductive paste CP, such as being completely filled with the conductive paste CP.

In the illustrated exemplary embodiment, the conductive paste CP moves by a capillary phenomenon. In more detail, an adhesive force is generated between the first to third guiding dams 411 to 413 and the conductive paste CP, and the conductive past CP moves within the space at the first and second connection areas CA1 and CA2 in the second direction DR2 by the adhesive force. To this end, the shape and material of the first to third guiding dams 411 to 413 and the material of the conductive paste CP may be determined in various ways such the adhesive force therebetween becomes greater than a cohesiveness of the conductive paste CP. That is, an adhesive force within the material of the conductive paste CP is smaller than the adhesive force between the conductive paste CP and the first to third guiding dams 411 to 413.

In an exemplary embodiment, gravity may be used to effectively move the conductive paste CP. In more detail, when the first and second base substrates 110 and 130 originally disposed in planes defined in the first and second directions DR1 and DR2, are disposed or rotated such that lengths (e.g., second direction DR2) of the first to third guiding dams 411 to 413 are substantially parallel to a gravity direction, the conductive paste CP flows from outside the first and second base substrates 110 and 130 and down along the lengths of the first to third guiding dams 411 to 413 (e.g., in the second direction DR2) due to the gravity.

Figure 5F:
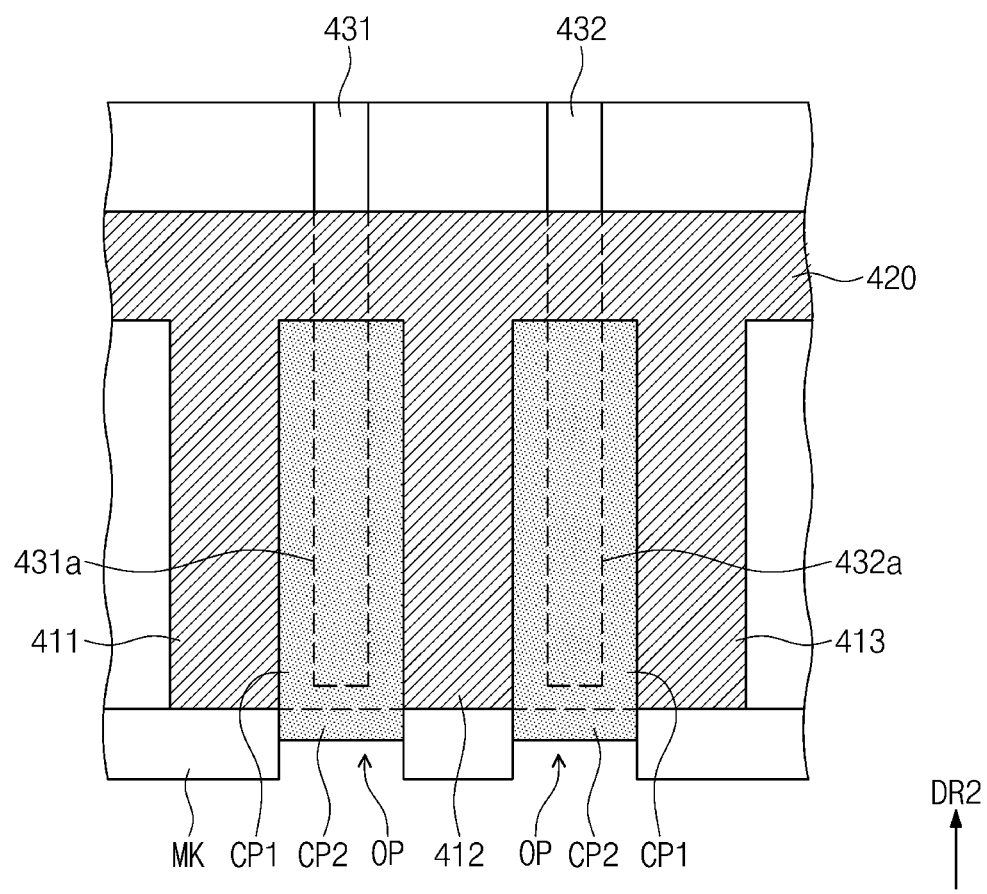
Figure 5G:
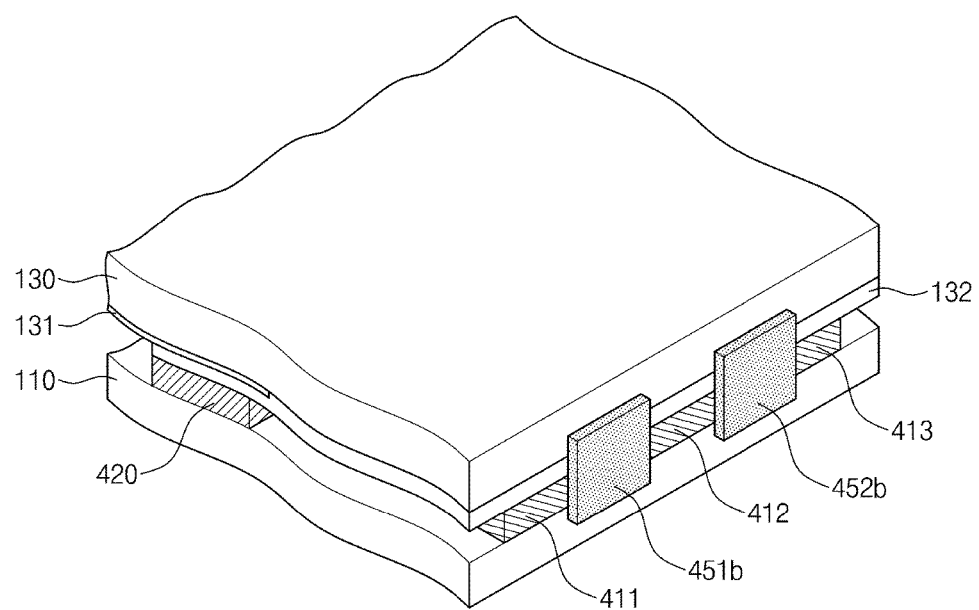

Referring to FIGS. 5F and 5G among portions of the conductive paste CP transferred into and through the openings OP, the conductive paste portion CP1 filled in the first and second connection areas CA1 and CA2 is cured, and thus the first and second horizontal portions 451a and 452a (refer to FIG. 2) are formed. The conductive paste portion CP1 terminates at the outer edge of the first and second base substrates 110 and 130. The curing of the conductive paste portion CP1 may be processed with the mask MK still in contact with the outer side surfaces of the first and second base substrates 110 and 130.

In addition, since the mask MK is disposed outside the first and second base substrates 110 and 130, a portion of the conductive past CP transferred into the openings OP may remain outside of the first and second base substrates 110 and 130. Among portions of the conductive paste CP transferred into and through the openings OP, the conductive paste portion CP2 remaining in the openings OP of the mask MK while the mask MK is in contact with the outer side surfaces of the first and second base substrates 110 and 130 is cured to form the first and second vertical portions 451b and 452b (refer to FIG. 2) disposed outside the first and second base substrates 110 and 130. Where the conductive paste portion CP2 is cured while remaining in the openings OP, an overall shape of the first and second vertical portions 451b and 452b may be determined depending on the overall shape of the openings OP disposed outside the first and second base substrates 110 and 130. The thickness of the first and second vertical portion 451b and 452b taken in the second direction DR2 may be determined depending on an amount of the conductive paste CP2 remaining outside the first and second base substrates 110 and 130 and in the openings OP in the second direction DR2.

Since the first and second horizontal portions 451a and 452a and the first and second vertical portion 451b and 452b are all formed from a same conductive paste material layer, the first and second side pads 451 and 452 (refer to FIG. 2) may be a single, unitary (e.g., integral) member. An entire of the first and second vertical portion 451*b* and 452*b* may be disposed outside the first and second base substrates 110 and 130, such that outer surfaces of the first and second vertical portion 451*b* and 452*b* (refer to 451_OS in FIG. 3C) are exposed outside the first and second base substrates 110 and 130.

Figure 5H:
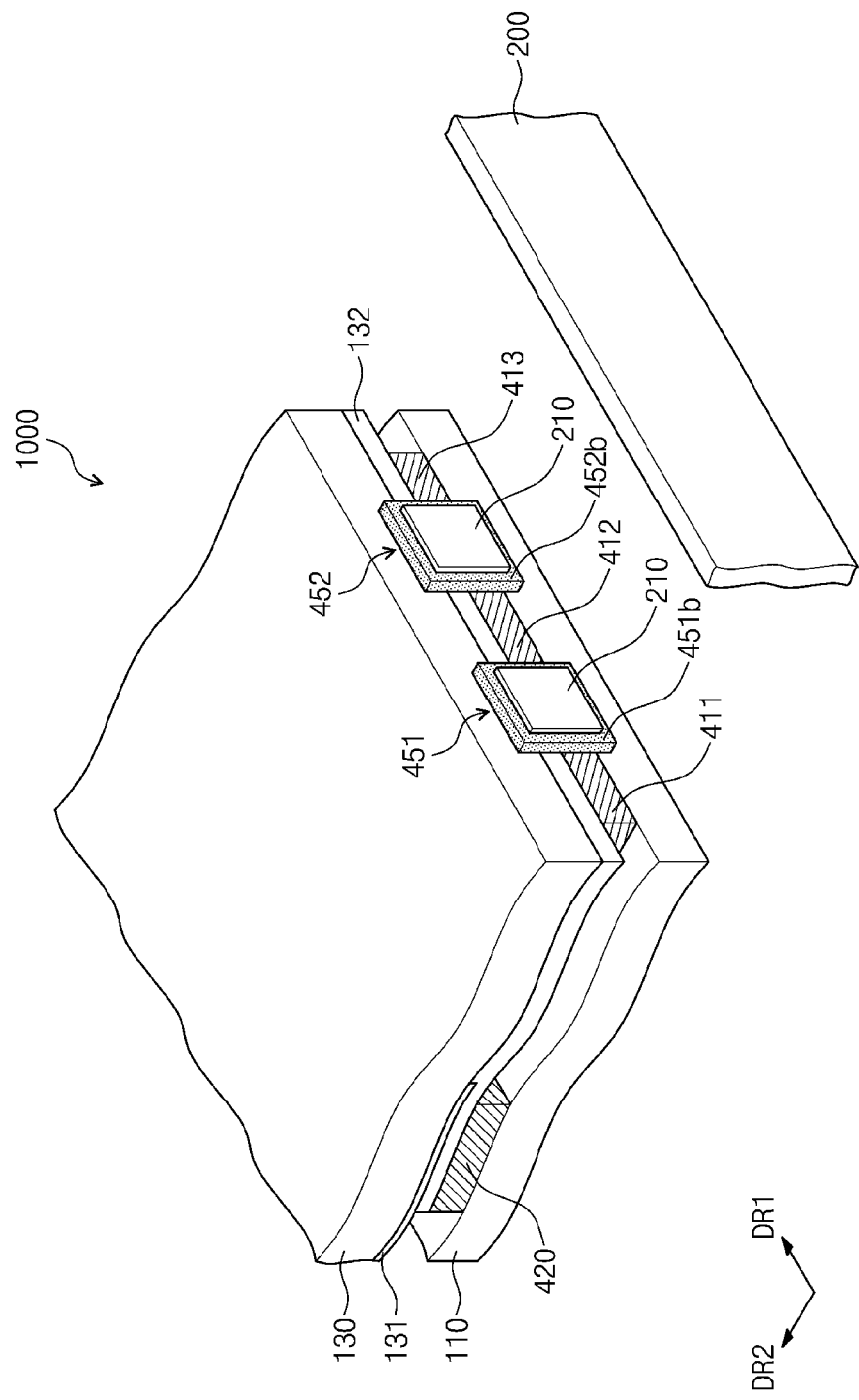

Referring to FIG. 5H, the anisotropic conductive film 210 is interposed between the exposed outer surfaces of the first and second vertical portions 451*b* and 452*b* and an inner surface of the flexible printed circuit board 200. The first and second side pads 451 and 452 are connected to the flexible printed circuit board 200 with the anisotropic conductive film 210 interposed therebetween. In an exemplary embodiment, a pressure and heat may be applied in the second direction DR2 to the anisotropic conductive film 210 interposed between the first and second vertical portions 451*b* and 452*b* and the flexible printed circuit board 200 to thermocompress bond the anisotropic conductive film 210, thereby connecting the first and second side pads 451 and 452 to the flexible printed circuit board 200. In an exemplary embodiment, the anisotropic conductive film 210 connects the first and second side pads 451 and 452 to pads (not shown) of the flexible printed circuit board 200, which are insulated from each other.

As described above, the first and second horizontal portions 451*a* and 452*a* may be effectively formed by using the first to third guiding dams 411 to 413 previously disposed on the first base substrate 110. As such, the process time, the process cost, and the yield of the manufacturing method of the display apparatus 1000 may be improved.

Figure 6A:
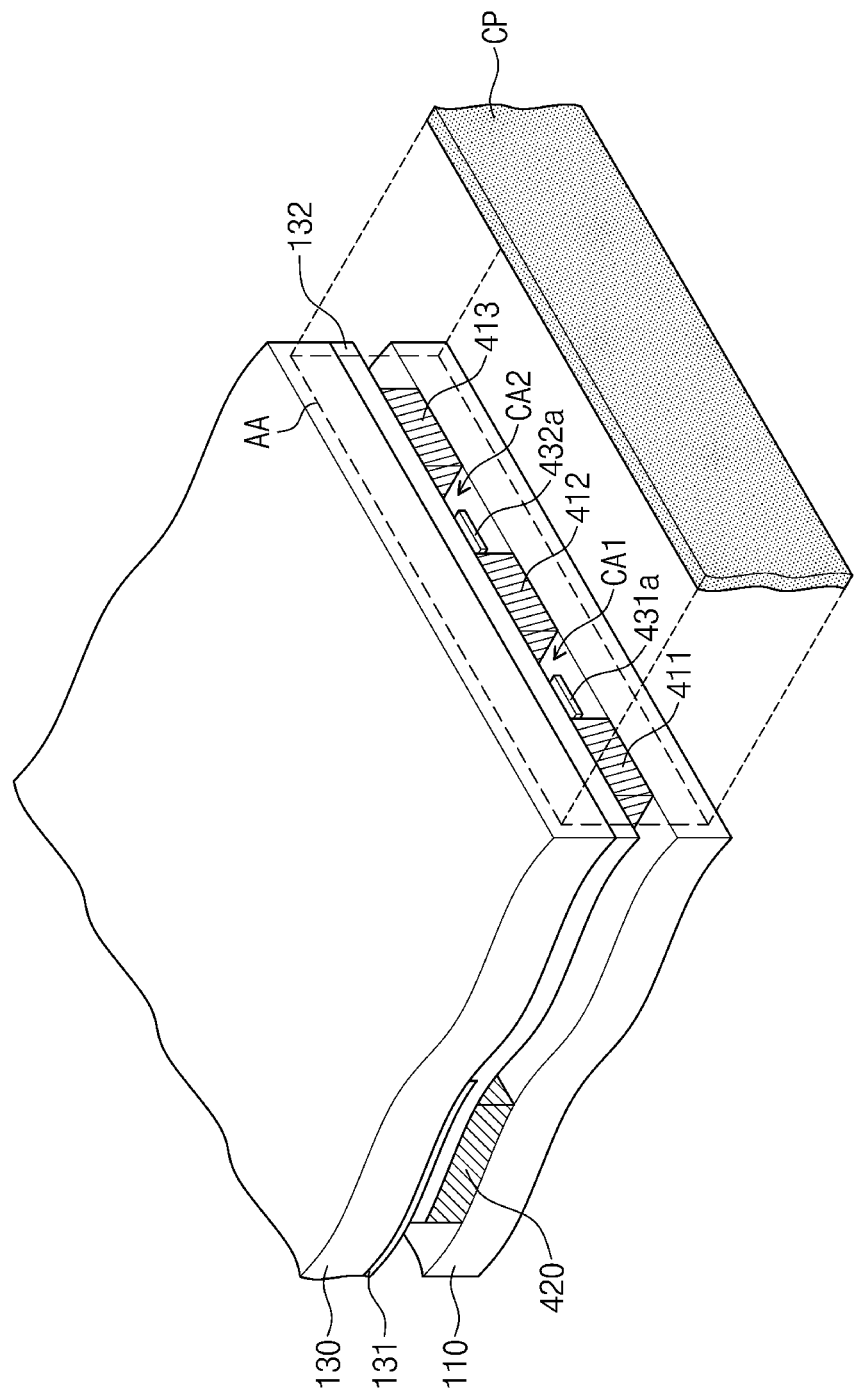
FIGS. 6A to 6C are perspective views explaining another exemplary embodiment of a method of manufacturing a display apparatus according to the invention.
Figure 6B:
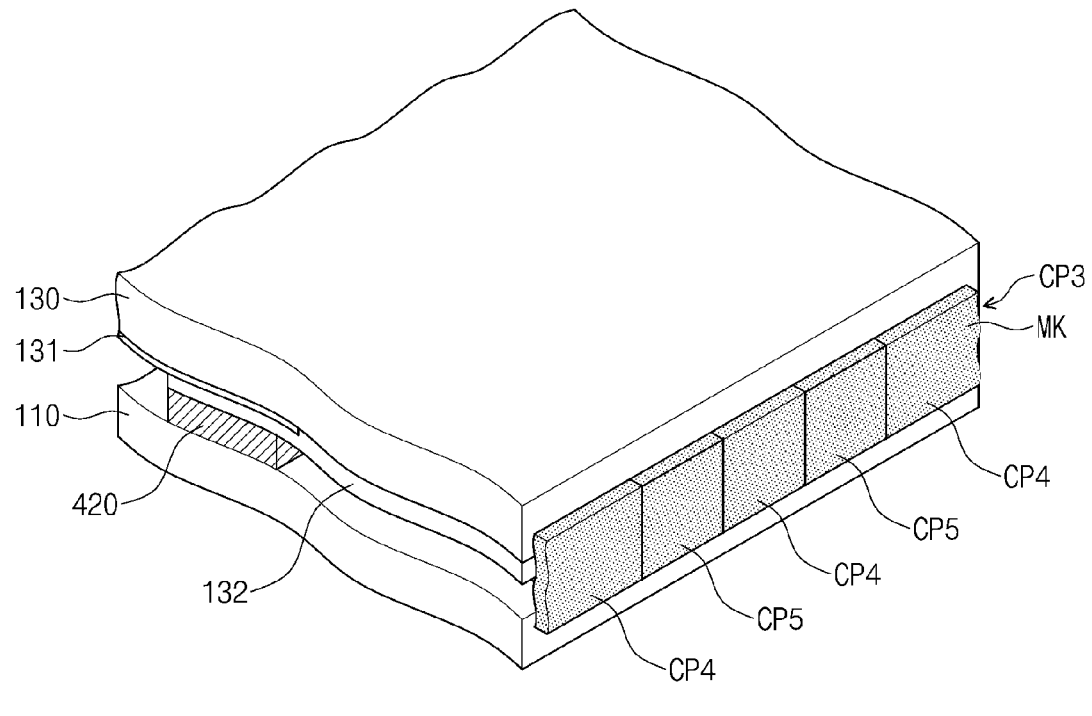
Figure 6C:
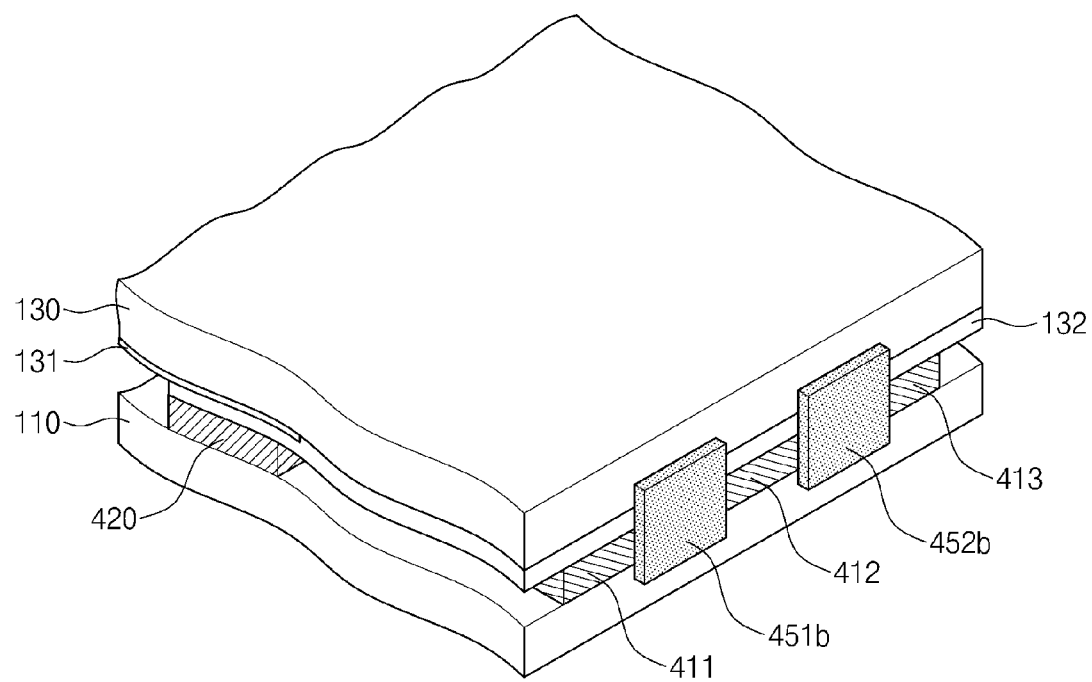

FIGS. 6A to 6C are perspective views explaining processes in another exemplary embodiment of a method of manufacturing a display apparatus according to the invention.

The exemplary embodiment of a method of manufacturing a display apparatus illustrated in FIGS. 6A to 6C may include those processes illustrated in FIGS. 5A through 5C, except for aligning a mask (refer to MK in FIG. 5C) with the exposed side surfaces of the first and second base substrates 110 and 130.

In FIG. 6A, the second base substrate 130 such as having layers (e.g., 131, 132, etc.) of a second display substrate thereon, is coupled to the first base substrate 110 having the layers of the first display substrate thereon. Side surfaces of at least the first and second base substrates 110 and 130 at outer edges thereof, are exposed outside the first and second base substrates 110 and 130.

Referring to FIG. 6A, with the second base substrate 130 coupled to the first base substrate 110 and outer side surfaces thereof exposed, the conductive paste CP may be coated on a side surface area AA defined on the exposed substrate side surface 112 of the first base substrate 110. In an exemplary embodiment, the side surface area AA adjacent to the substrate side surface 112 is defined at the side surface of the display panel 100, and thus includes areas corresponding to exposed side surfaces of the first to third guiding dams 411 to 413, an exposed side surface of the insulating layer 132, and exposed side surfaces of the first and second base substrates 110 and 130.

As described above, with the conductive paste CP coated on the exposed side surfaces of the first to third guiding dams 411 to 413, the insulating layer 132 and the first and second base substrates 110 and 130 at side surface area AA, the conductive paste CP is moved from the outer side surfaces to inside the space formed around the first and second signal lines 431 and 432 at the first and second connection areas CA1 and CA2. In an exemplary embodiment, with the movement of the conductive paste CP in the second direction DR2 within the space at the first and second connection areas CA1 and CA2, the space at the first and second connection areas CA1 and CA2 is filled with the conductive paste CP, such as being completely filled with the conductive paste CP.

Referring to FIG. 6B, other than a portion of the conductive paste CP that is transferred into the space at the first and second connection areas CA1 and CA2, a portion of the conductive paste CP3 remains on the substrate side surface 112 at the side surface area AA to be disposed outside the elements of the first and second display substrates. A portion of the conductive paste CP3 remaining on the substrate side surface 112 at the side surface area AA may be removed. In more detail, a portion CP4 of the remaining conductive paste CP3, which is overlapped with the first to third guiding dams 411 to 413 in the second direction DR2, is removed and the first to third guiding dams 411 are exposed to outside the first and second display substrates. As a result, a portion CP5 of the conductive paste CP3, which is not removed, becomes the first and second vertical portions 451*b* and 452*b* of first and second side pads 451 and 452 (refer to FIG. 2). Accordingly, with the removal of the portion the first and second vertical portions 451*b* and 452*b* shown in FIG. 6C are formed.

Once the first and second vertical portions 451*b* and 452*b* of the first and second side pads 451 and 452 are formed, referring to FIG. 5H and the description thereof, an anisotropic conductive film 210 connects the first and second side pads 451 and 452 to the pads (not shown) of the flexible printed circuit board 200, which are insulated from each other.

As described above for the method processes of FIGS. 6A-6C, the first and second horizontal portions 451*a* and 452*a* may be effectively formed by using the first to third guiding dams 411 to 413 previously disposed on the first base substrate 110. As such, the process time, the process cost, and the yield of the manufacturing method of the display apparatus 1000 may be improved.

Figure 7:
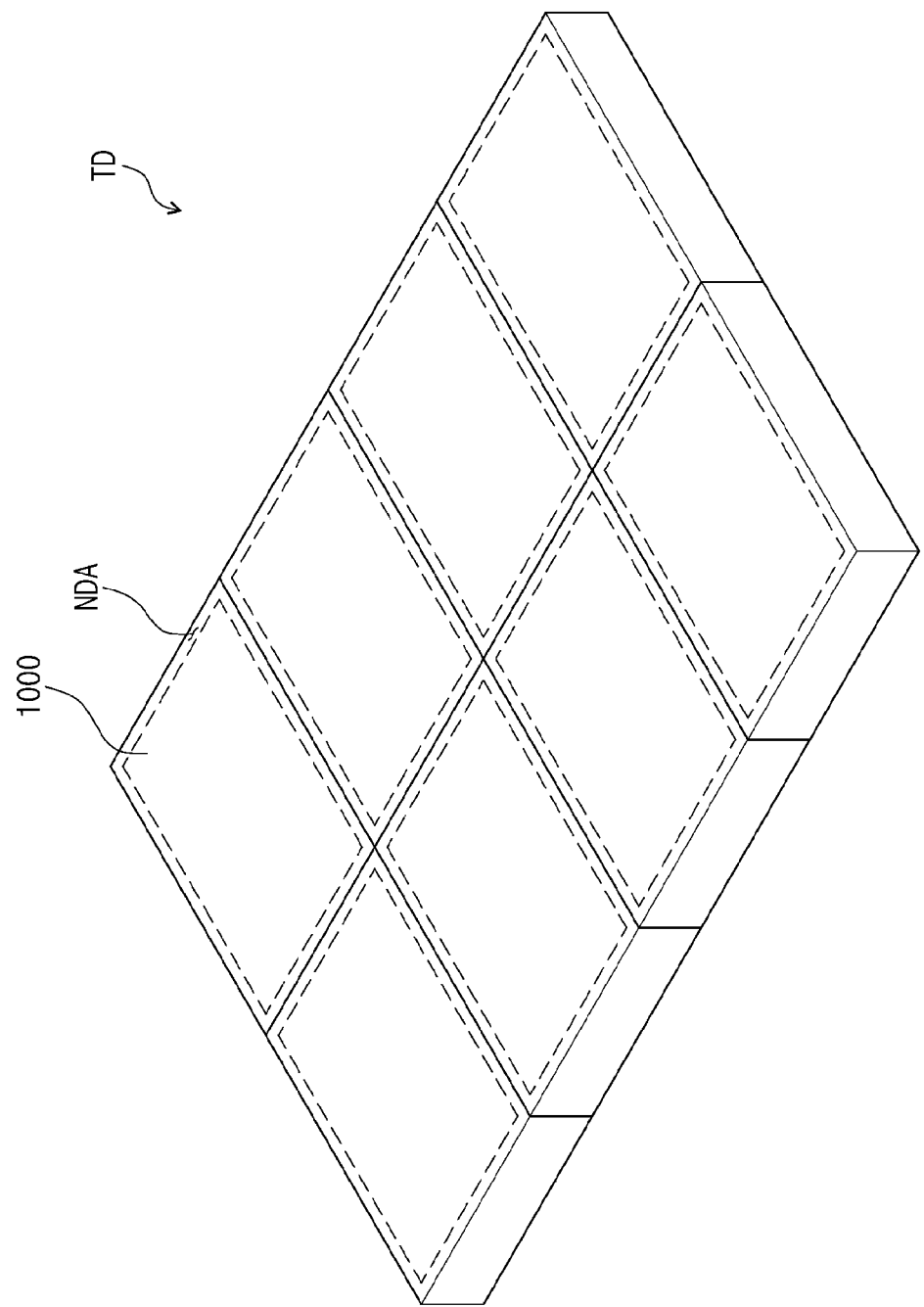
FIG. 7 is a perspective view showing an exemplary embodiment of a tiled display apparatus including more than one of a display apparatus according to the invention.

FIG. 7 is a perspective view showing an exemplary embodiment of a tiled display apparatus including more than one of a display apparatus according to the invention.

Referring to FIG. 7, a display apparatus 1000 is provided in plural and coupled to each other to form the tiled display apparatus TD displaying a relatively large overall image. The display apparatuses 1000 are arranged in an M-by-N matrix (each of M and N is a natural number) and coupled to each other. As described above, since the flexible printed circuit board 200 (refer to FIG. 3C) is connected to the first and second signal lines 431 and 432 of a display panel 100 (refer to FIG. 3C) through the first and second side pads 451 and 452 (refer to FIG. 3C), the non-display area NDA, e.g., the bezel, of each of the display apparatuses 1000 may become relatively small. Accordingly, a boundary between adjacent display apparatuses 1000 within the tiled display TD is not perceived by a user of the tiled display TD, and thus the tiled display device TD displays a seamless relatively large image. As a result, since the boundary between adjacent display apparatuses 1000 within the tiled display TD is not perceived by a user, a display quality of the tiled display device TD may be improved.

Although exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A display apparatus comprising:
    a first base substrate comprising a display area and a non-display area;
    a plurality of pixels disposed on the display area of the first base substrate;
    a plurality of signal lines electrically connected to the plurality of the pixels, disposed on the first base substrate and extending from the display area to the non-display area;
    a portion of an upper surface of the first base substrate being exposed between adjacent signal lines; and
    a side pad comprising:
        a horizontal portion disposed on one of the plurality of the signal lines and in contact with the one of the plurality of the signal lines, the horizontal portion on and in contact with the one of the plurality of the signal lines extended to the exposed portion of the upper surface of the first base substrate between the adjacent signal lines, and
        a vertical portion connected to the horizontal portion and disposed on a side surface of the first base substrate.

2. The display apparatus of claim 1, further comprising a plurality of dams disposed between the plurality of the signal lines, wherein the plurality of the dams and the plurality of the signal lines are alternately arranged one to one, in a top plan view.

3. The display apparatus of claim 2, wherein among the plurality of dams, the horizontal portion of the side pad contacts the dams adjacent to the horizontal portion.

4. The display apparatus of claim 2, wherein the plurality of the dams are spaced apart in a first direction, and each of the plurality of the dams are extend along a second direction intersecting the first direction.

5. The display apparatus of claim 4, further comprising a connection insulating portion extending in the first direction and disposed on the first base substrate, the connection insulation portion is connected to an inner end of each of the plurality of the dams.

6. The display apparatus of claim 5, wherein the plurality of the dams and the connection insulating portion enclose the horizontal portion and expose the vertical portion, in the top plan view.

7. The display apparatus of claim 5, wherein a thickness of the connection insulating portion and a thickness of the horizontal portion are the same.

8. The display apparatus of claim 5, wherein a thickness of the horizontal portion is smaller than a thickness of the connection insulating portion.

9. The display apparatus of claim 5, wherein the connection insulating portion and the horizontal portion are not in contact with each other.

10. The display apparatus of claim 4, further comprising a second base substrate facing the first base substrate and spaced apart from the first base substrate in a third direction intersecting the first direction and the second direction,
    wherein the horizontal portion of the side pad is disposed between the first and second base substrates.

11. The display apparatus of claim 10, wherein the vertical portion extends from the side surface of the first base substrate to a side surface of the second base substrate along the third direction and a portion of the vertical portion is disposed on the side surface of the second base substrate.

12. The display apparatus of claim 10, further comprising:
    a printed circuit board which provides signal to the plurality of the pixels; and
    an anisotropic conductive film interposed between the vertical portion and the printed circuit board to connect the vertical portion and the printed circuit board to each other.

13. The display apparatus of claim 12, wherein the anisotropic conductive film overlaps with the first base substrate in the second direction.

14. The display apparatus of claim 13, wherein the anisotropic conductive film is not overlapped with the second base substrate in the second direction.

15. The display apparatus of claim 12, wherein the anisotropic conductive film overlaps with the first base substrate and the second base substrate in the second direction.

16. The display apparatus of claim 10, further comprising:
    an upper conductive layer disposed on a lower surface of the second base substrate; and
    an insulating layer disposed on the lower surface of the second base substrate and between the upper conductive layer and the horizontal portion of the side pad.

17. The display apparatus of claim 2, wherein in the top plan view, the one of the plurality of the signal lines comprises a distal end overlapped with the horizontal portion of the side pad.

18. The display apparatus of claim 17, wherein
    a portion of the upper surface of the first base substrate is exposed between the distal end of the one of the plurality of the signal lines and an outer edge of the first base substrate, and
    the horizontal portion overlapping the distal end of the one of the plurality of the signal lines extends from the distal end to the exposed portion of the upper surface of the first base substrate between the distal end and the outer edge.

19. A display apparatus comprising:
    a first substrate comprising a display area and a non-display area;
    a plurality of pixels disposed on the display area of the first base substrate;
    a plurality of signal lines electrically connected to the plurality of the pixels, disposed on the first base substrate and extending from the display area to the non-display area;
    a side pad comprising a horizontal portion disposed on one of the plurality of the signal lines and in contact with the one of the plurality of the signal lines, and a vertical portion connected to the horizontal portion and disposed on a side surface of the first base substrate; and
    a plurality of dams disposed between the plurality of the signal lines, wherein the plurality of the dams and the plurality of the signal lines are alternately arranged one to one along a first direction, in a top plan view,
    wherein the horizontal portion is disposed between two dams adjacent to each other among the plurality of dams, and a distance between the adjacent two dams is equal to or greater than a width of the horizontal portion in the first direction.

20. A display apparatus comprising:
    a first substrate comprising a display area and a non-display area;
    a plurality of pixels disposed on the display area of the first base substrate;
    a plurality of signal lines electrically connected to the plurality of the pixels, disposed on the first base substrate and extending from the display area to the non-display area;

a side pad comprising a horizontal portion disposed on one of the plurality of the signal lines and in contact with the one of the plurality of the signal lines, and a vertical portion connected to the horizontal portion and disposed on a side surface of the first base substrate; and
a plurality of dams disposed between the plurality of signal lines and disposed on a same layer as the plurality of signal lines.

* * * * *